United States Patent
Hu et al.

(10) Patent No.: US 9,293,393 B2
(45) Date of Patent: Mar. 22, 2016

(54) STACKED PACKAGING USING RECONSTITUTED WAFERS

(71) Applicant: BROADCOM CORPORATION, Irvine, CA (US)

(72) Inventors: Kevin Kunzhong Hu, Irvine, CA (US); Sam Ziqun Zhao, Irvine, CA (US); Rezaur Rahman Khan, Rancho Santa Margarita, CA (US); Pieter Vorenkamp, Laguna Niguel, CA (US); Sampath K. V. Karikalan, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/175,985

(22) Filed: Feb. 7, 2014

(65) Prior Publication Data
US 2014/0151900 A1     Jun. 5, 2014

Related U.S. Application Data

(63) Continuation of application No. 13/325,951, filed on Dec. 14, 2011, now abandoned.

(51) Int. Cl.
*H01L 23/48* (2006.01)
*H01L 23/00* (2006.01)
(Continued)

(52) U.S. Cl.
CPC .............. *H01L 23/481* (2013.01); *H01L 21/50* (2013.01); *H01L 24/19* (2013.01); *H01L 24/92* (2013.01); *H01L 24/96* (2013.01); *H01L 25/0657* (2013.01); *H01L 25/50* (2013.01); *H01L 24/13* (2013.01); *H01L 24/16* (2013.01); *H01L 24/24* (2013.01); *H01L 24/32* (2013.01); *H01L 24/82* (2013.01); *H01L 24/83* (2013.01); *H01L 2224/0401* (2013.01);
(Continued)

(58) Field of Classification Search
CPC .............. H01L 23/481; H01L 2224/97; H01L 2224/32225; H01L 24/96; H01L 25/50; H01L 25/0657
See application file for complete search history.

(56) References Cited

U.S. PATENT DOCUMENTS 5,198,963 A    3/1993 Gupta et al.
6,002,168 A   12/1999 Bellaar et al.
(Continued)

FOREIGN PATENT DOCUMENTS

| CN | 101409241 A | 4/2009 |
|---|---|---|
| CN | 101809739 A | 8/2010 |
| KR | 10-2011-0036249 | 4/2011 |
| WO | WO-2009/017758 A2 | 2/2009 |

\* cited by examiner

*Primary Examiner* — Matthew Landau
*Assistant Examiner* — Grant Withers
(74) *Attorney, Agent, or Firm* — McDermott Will & Emery LLP

(57) ABSTRACT

An exemplary implementation of the present disclosure includes a stacked package having a top die from a top reconstituted wafer situated over a bottom die from a bottom reconstituted wafer. The top die and the bottom die are insulated from one another by an insulation arrangement. The top die and the bottom die are also interconnected through the insulation arrangement. The insulation arrangement can include a top molding compound that flanks the top die and a bottom molding compound that flanks the bottom die. The top die and the bottom die can be interconnected through at least the top molding compound. Furthermore, the top die and the bottom die can be interconnected through a conductive via that extends within the insulation arrangement.

20 Claims, 6 Drawing Sheets

(51) Int. Cl.
  *H01L 25/065* (2006.01)
  *H01L 25/00* (2006.01)
  *H01L 21/50* (2006.01)

(52) U.S. Cl.
  CPC ............ *H01L 2224/04105* (2013.01); *H01L 2224/05548* (2013.01); *H01L 2224/05572* (2013.01); *H01L 2224/12105* (2013.01); *H01L 2224/131* (2013.01); *H01L 2224/16145* (2013.01); *H01L 2224/24011* (2013.01); *H01L 2224/24146* (2013.01); *H01L 2224/2919* (2013.01); *H01L 2224/821* (2013.01); *H01L 2224/82039* (2013.01); *H01L 2224/82047* (2013.01); *H01L 2224/83* (2013.01); *H01L 2224/9202* (2013.01); *H01L 2224/92133* (2013.01); *H01L 2224/92144* (2013.01); *H01L 2224/92244* (2013.01); *H01L 2224/96* (2013.01); *H01L 2225/06517* (2013.01); *H01L 2225/06524* (2013.01); *H01L 2225/06527* (2013.01); *H01L 2225/06548* (2013.01); *H01L 2924/00014* (2013.01); *H01L 2924/12042* (2013.01); *H01L 2924/15747* (2013.01); *H01L 2924/181* (2013.01)

(56) References Cited

U.S. PATENT DOCUMENTS

| | | | |
|---|---|---|---|
| 6,188,578 B1 | 2/2001 | Lin et al. | |
| 6,400,573 B1* | 6/2002 | Mowatt et al. | 361/719 |
| 6,461,895 B1 | 10/2002 | Liang et al. | |
| 6,709,898 B1 | 3/2004 | Ma et al. | |
| 6,743,661 B1 | 6/2004 | Drewery | |
| 6,791,195 B2 | 9/2004 | Urushima | |
| 6,952,049 B1 | 10/2005 | Ogawa et al. | |
| 7,208,343 B2* | 4/2007 | Song et al. | 438/106 |
| 7,220,667 B2 | 5/2007 | Yamagata | |
| 7,262,615 B2 | 8/2007 | Cheng et al. | |
| 7,585,702 B1 | 9/2009 | Wang et al. | |
| 7,675,163 B2 | 3/2010 | Heydari et al. | |
| 7,834,450 B2 | 11/2010 | Kang | |
| 7,838,337 B2 | 11/2010 | Marimuthu et al. | |
| 7,901,986 B2 | 3/2011 | Arai et al. | |
| 7,901,989 B2 | 3/2011 | Haba et al. | |
| 7,956,453 B1* | 6/2011 | Kim et al. | 257/692 |
| 8,008,125 B2* | 8/2011 | McConnelee et al. | 438/109 |
| 8,018,068 B1* | 9/2011 | Scanlan et al. | 257/774 |
| 8,021,927 B2 | 9/2011 | Khan et al. | |
| 8,022,555 B2 | 9/2011 | Hwang et al. | |
| 8,030,208 B2 | 10/2011 | Leung et al. | |
| 8,133,761 B2 | 3/2012 | Gerber et al. | |
| 8,188,594 B2 | 5/2012 | Ganesan et al. | |
| 8,202,763 B2 | 6/2012 | Meyer et al. | |
| 8,298,866 B1* | 10/2012 | Huemoeller et al. | 438/119 |
| 8,304,913 B2 | 11/2012 | Nalla et al. | |
| 8,310,063 B2 | 11/2012 | Wang | |
| 8,344,516 B2 | 1/2013 | Chainer | |
| 8,461,672 B2 | 6/2013 | Haba et al. | |
| 8,828,796 B1* | 9/2014 | Chi et al. | 438/106 |
| 9,048,234 B2* | 6/2015 | Haba et al. | |
| 2002/0030261 A1 | 3/2002 | Rolda et al. | |
| 2003/0036219 A1 | 2/2003 | Masumoto et al. | |
| 2005/0218518 A1 | 10/2005 | Jiang et al. | |
| 2005/0248015 A1 | 11/2005 | Palanduz | |
| 2006/0145328 A1 | 7/2006 | Hsu | |
| 2006/0186531 A1 | 8/2006 | Hsu | |
| 2006/0186536 A1 | 8/2006 | Hsu | |
| 2006/0220262 A1 | 10/2006 | Meyer et al. | |
| 2006/0244470 A1 | 11/2006 | Shinde et al. | |
| 2006/0258044 A1 | 11/2006 | Meyer et al. | |
| 2007/0132082 A1 | 6/2007 | Tang et al. | |
| 2007/0181989 A1* | 8/2007 | Corisis et al. | 257/686 |
| 2007/0209831 A1 | 9/2007 | Sakamoto et al. | |
| 2007/0273049 A1 | 11/2007 | Khan et al. | |
| 2007/0290376 A1 | 12/2007 | Zhao et al. | |
| 2008/0044944 A1 | 2/2008 | Wakisaka et al. | |
| 2008/0083976 A1* | 4/2008 | Haba et al. | 257/686 |
| 2008/0083977 A1* | 4/2008 | Haba et al. | 257/686 |
| 2008/0128882 A1 | 6/2008 | Baek et al. | |
| 2008/0157322 A1 | 7/2008 | Tang et al. | |
| 2008/0157328 A1 | 7/2008 | Kawata | |
| 2008/0224296 A1* | 9/2008 | Meyer et al. | 257/687 |
| 2008/0246138 A1 | 10/2008 | Gerber et al. | |
| 2008/0268638 A1 | 10/2008 | Dertinger et al. | |
| 2009/0053858 A1 | 2/2009 | Ko et al. | |
| 2009/0102030 A1 | 4/2009 | Khan et al. | |
| 2009/0140415 A1 | 6/2009 | Furuta | |
| 2009/0160065 A1 | 6/2009 | Haba et al. | |
| 2009/0289336 A1* | 11/2009 | Meghro et al. | 257/676 |
| 2009/0294914 A1* | 12/2009 | Pagaila et al. | 257/621 |
| 2010/0019360 A1 | 1/2010 | Khan et al. | |
| 2010/0072606 A1* | 3/2010 | Yang | 257/692 |
| 2010/0084754 A1 | 4/2010 | Yoo et al. | |
| 2010/0133534 A1 | 6/2010 | Do et al. | |
| 2010/0148360 A1 | 6/2010 | Lin et al. | |
| 2010/0230795 A1* | 9/2010 | Kriman et al. | 257/686 |
| 2010/0258944 A1* | 10/2010 | Uchiyama et al. | 257/773 |
| 2010/0301474 A1 | 12/2010 | Yang | |
| 2011/0006432 A1 | 1/2011 | Haba et al. | |
| 2011/0024888 A1 | 2/2011 | Pagaila et al. | |
| 2011/0024906 A1 | 2/2011 | Meyer et al. | |
| 2011/0039370 A1* | 2/2011 | Gomyo et al. | 438/109 |
| 2011/0068459 A1* | 3/2011 | Pagaila et al. | 257/698 |
| 2011/0241185 A1 | 10/2011 | Koester et al. | |
| 2011/0248410 A1* | 10/2011 | Avsian et al. | 257/777 |
| 2011/0254160 A1 | 10/2011 | Tsai et al. | |
| 2011/0272819 A1 | 11/2011 | Park et al. | |
| 2011/0278732 A1 | 11/2011 | Yu et al. | |
| 2011/0285030 A1 | 11/2011 | Meyer et al. | |
| 2012/0009738 A1 | 1/2012 | Crawford et al. | |
| 2012/0018899 A1 | 1/2012 | Pagaila et al. | |
| 2012/0020026 A1* | 1/2012 | Oganesian et al. | 361/707 |
| 2012/0032340 A1* | 2/2012 | Choi et al. | 257/774 |
| 2012/0056312 A1* | 3/2012 | Pagaila et al. | 257/684 |
| 2012/0062439 A1 | 3/2012 | Liao et al. | |
| 2012/0126394 A1* | 5/2012 | Huang | 257/737 |
| 2012/0139105 A1 | 6/2012 | Lin et al. | |
| 2012/0142145 A1* | 6/2012 | Abe | 438/107 |
| 2012/0152605 A1 | 6/2012 | Das et al. | |
| 2012/0168935 A1* | 7/2012 | Huang | 257/737 |
| 2012/0168942 A1 | 7/2012 | Gan et al. | |
| 2012/0211885 A1 | 8/2012 | Choi et al. | |
| 2012/0223429 A1 | 9/2012 | Khan et al. | |
| 2012/0225522 A1 | 9/2012 | Zhao et al. | |
| 2012/0228753 A1 | 9/2012 | Ko et al. | |
| 2012/0241921 A1 | 9/2012 | Lee et al. | |
| 2012/0292785 A1 | 11/2012 | Pagaila et al. | |
| 2012/0299191 A1* | 11/2012 | Camacho | 257/774 |
| 2012/0313240 A1 | 12/2012 | Cheng et al. | |
| 2012/0319284 A1 | 12/2012 | Ko et al. | |
| 2012/0319293 A1 | 12/2012 | Cheah et al. | |
| 2013/0000968 A1 | 1/2013 | Zhao et al. | |
| 2013/0049227 A1* | 2/2013 | Kim | 257/777 |
| 2013/0062764 A1 | 3/2013 | Jin | |
| 2013/0069222 A1* | 3/2013 | Camacho | 257/737 |
| 2013/0069224 A1* | 3/2013 | Kim et al. | 257/737 |
| 2013/0069239 A1* | 3/2013 | Kim et al. | 257/774 |
| 2013/0075917 A1 | 3/2013 | Law et al. | |
| 2013/0105991 A1* | 5/2013 | Gan et al. | 257/777 |
| 2013/0113098 A1 | 5/2013 | Hwang et al. | |
| 2013/0147023 A1 | 6/2013 | Lin et al. | |
| 2013/0154091 A1 | 6/2013 | Wright et al. | 257/738 |
| 2013/0181354 A1 | 7/2013 | Khan et al. | |
| 2013/0193578 A1 | 8/2013 | Yu et al. | |
| 2013/0200512 A1* | 8/2013 | Wu | 257/737 |
| 2013/0200513 A1* | 8/2013 | Wu | 257/737 |
| 2013/0200528 A1 | 8/2013 | Lin et al. | |
| 2014/0225248 A1 | 8/2014 | Henderson et al. | 257/712 |
| 2014/0312481 A1* | 10/2014 | Choi et al. | 257/686 |
| 2015/0001731 A1* | 1/2015 | Shuto | 257/774 |

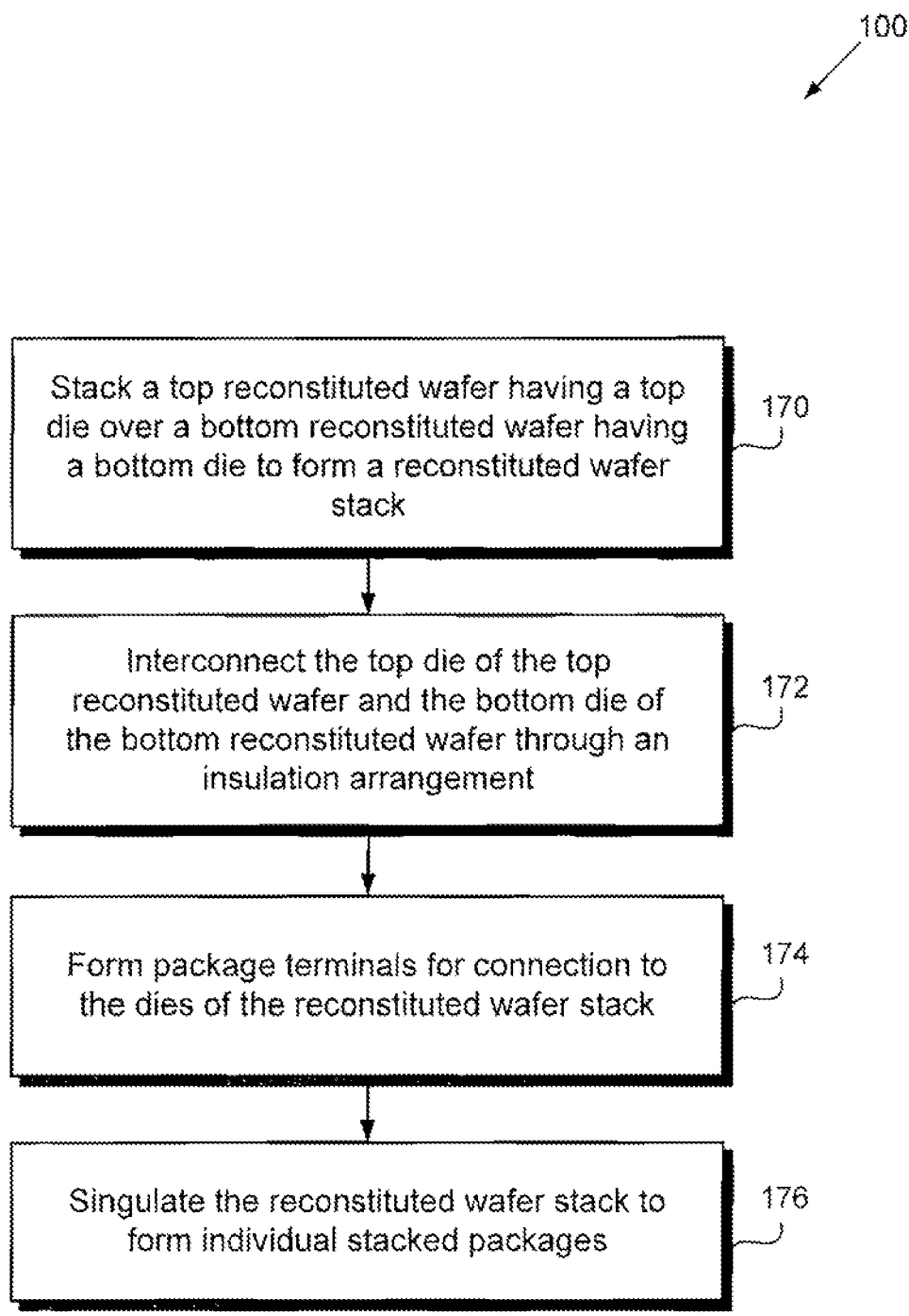

STACKED PACKAGING USING RECONSTITUTED WAFERS

CROSS-REFERENCE TO RELATED APPLICATIONS

This application is a continuation of U.S. patent application Ser. No. 13/325,951, filed on Dec. 14, 2011, entitled "Stacked Packaging Using Reconstituted Wafers," which is hereby incorporated by reference in its entirety.

BACKGROUND

Packaging for dies that include, for example, at least one integrated circuit (IC), is continually trending towards reduced package size with increased package density. For example, electronic devices that include these packages, such as cell phones, hands-free headsets, camcorders, cameras, and personal computers, continue to be made smaller. At the same time, these electronic devices increasingly demand higher levels of functionality. However, incorporating higher levels of functionality into these electronic devices tends to increase package size and reduce package density. For example, incorporating higher levels of functionality typically requires additional circuitry and/or dies. The additional circuitry and/or dies can complicate packaging. As one example, among other considerations, the additional circuitry and/or dies may require accommodation of additional input/output (I/O) pads.

Complications to packaging may be of particular concern in electronic devices, such as portable devices, where component space and layout options for packages are limited. For example, a cell phone may have a form factor that constrains component space in a particular dimension. One approach to coping with limited component space and layout options would be to stack packaged dies to reduce their combined footprint. For example, each of the packaged dies may be housed in a respective package. Then, using package level processes, the respective packages could be stacked on one another and interconnected.

SUMMARY

The present disclosure is directed to stacked packaging using reconstituted wafers, substantially as shown in and/or described in connection with at least one of the figures, and as set forth more completely in the claims.

BRIEF DESCRIPTION OF THE DRAWINGS

FIG. 1 presents an exemplary flowchart illustrating a method for manufacturing a stacked package, according to an implementation of the present disclosure.

DETAILED DESCRIPTION

Figure 2A:
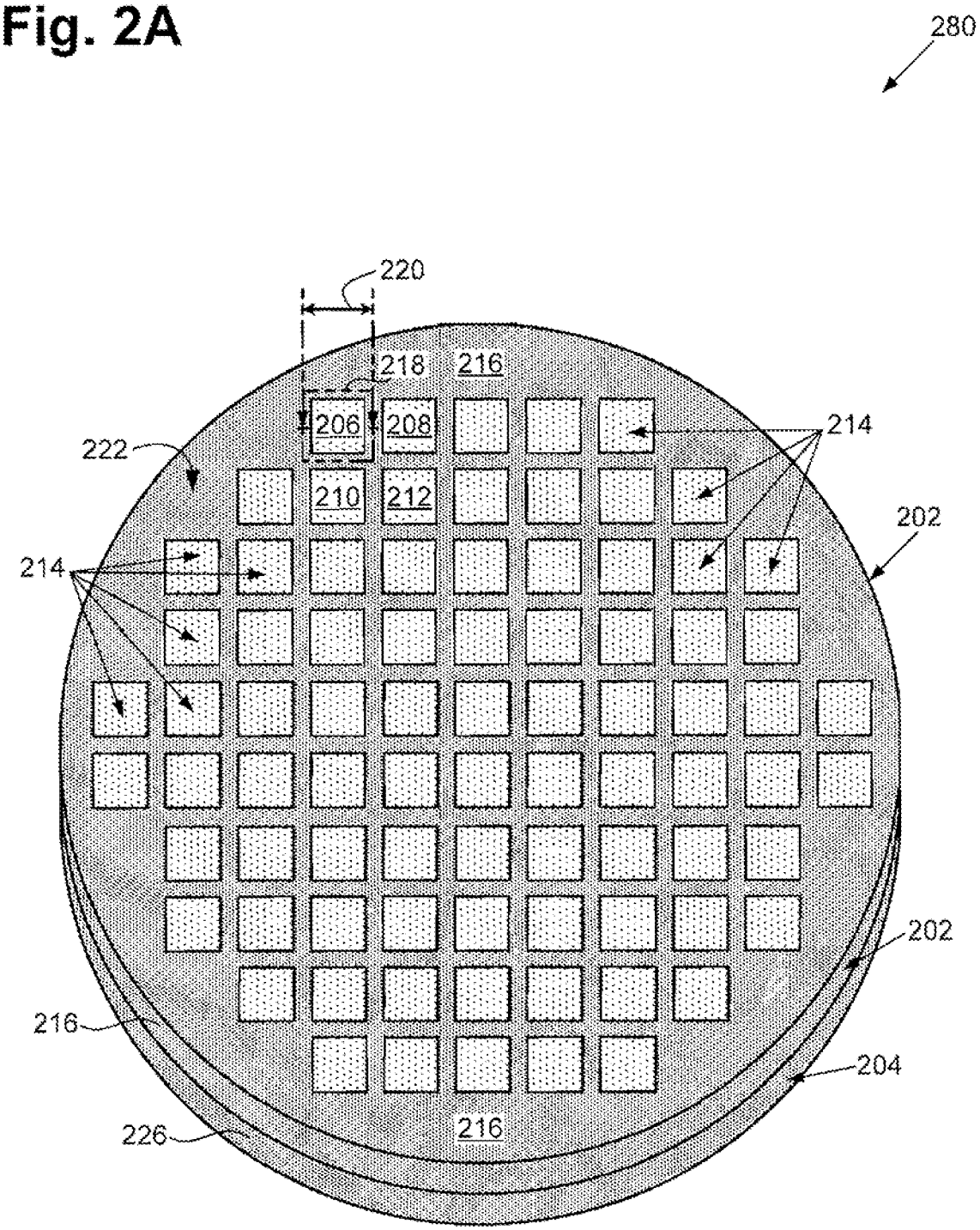
FIG. 2A presents an exemplary perspective view of a reconstituted wafer stack, according to an implementation of the present disclosure.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents exemplary flowchart 100 illustrating a method for manufacturing a stacked package. The approach and technique indicated by flowchart 100 are sufficient to describe at least one implementation of the present disclosure, however, other implementations of the disclosure may utilize approaches and techniques different from those shown in flowchart 100. Furthermore, while flowchart 100 is described with respect to FIGS. 2A, 2B, 2C, & 2D the disclosed inventive concepts are not intended to be limited by specific features shown in FIGS. 2A, 2B, 2C, & 2D.

Figure 2B:
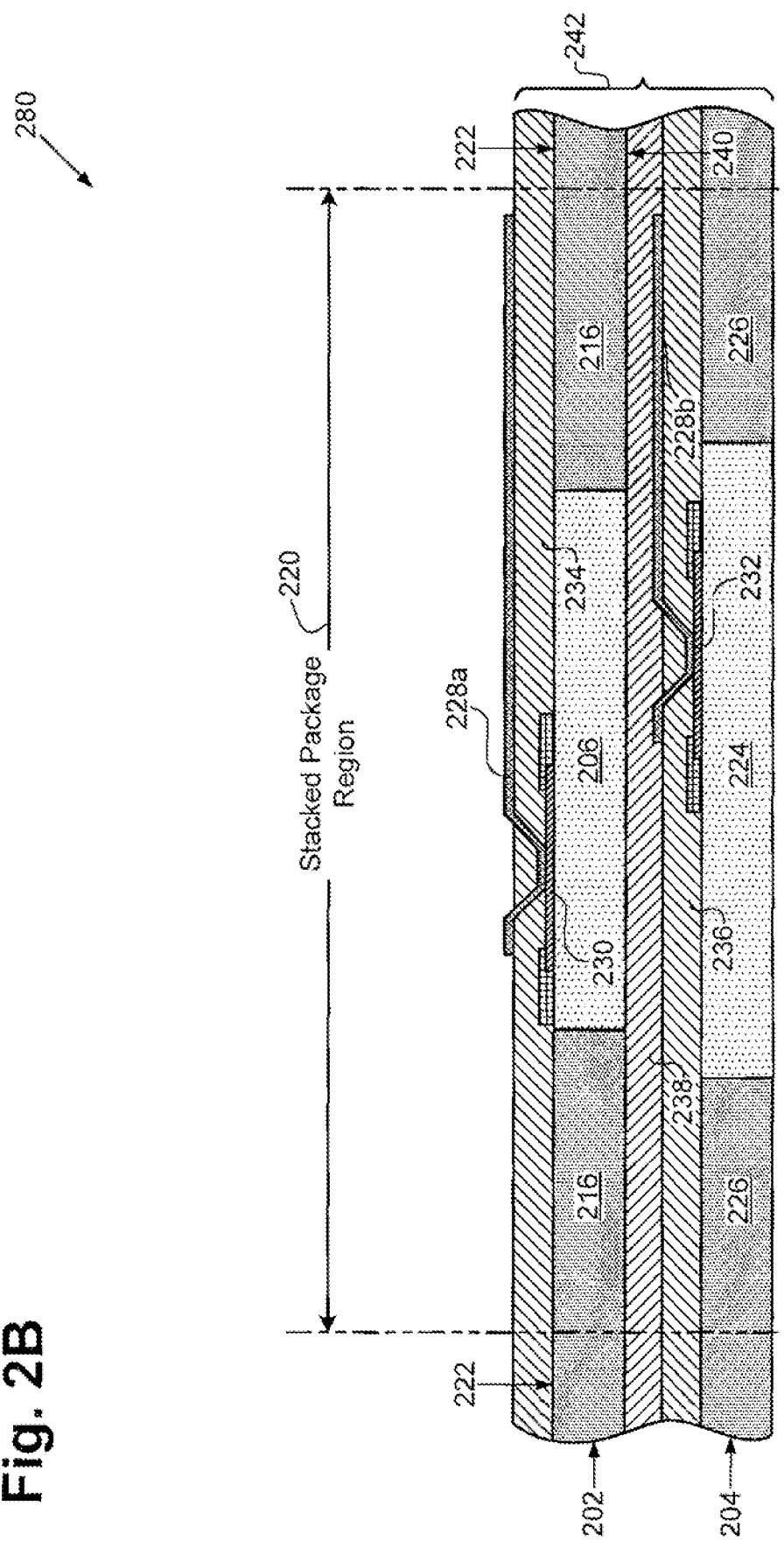
FIG. 2B presents an exemplary cross-sectional view of a portion of a reconstituted wafer stack, according to an implementation of the present disclosure.

Referring now to flowchart 100 of FIG. 1 and FIGS. 2A and 2B, flowchart 100 includes stacking a top reconstituted wafer having a top die over a bottom reconstituted wafer having a bottom die to form a reconstituted wafer stack (action 170 in flowchart 100). FIGS. 2A and 2B show portions of reconstituted wafer stack 280 after action 170, in accordance with implementations of the present disclosure.

FIG. 2A presents a perspective view of reconstituted wafer stack 280, according to an implementation of the present disclosure. Reconstituted wafer stack 280 includes top reconstituted wafer 202 and bottom reconstituted wafer 204. As shown in FIG. 2A, top reconstituted wafer 202 includes stacked package region 218, which is designated for formation of a stacked package, such as stacked package 284 in FIG. 2D. In FIG. 2A, stacked package region 218 is rectangular and extends completely through reconstituted wafer stack 280. FIG. 2B presents a cross-sectional view of a portion of reconstituted wafer stack 280 along cross-section 220.

As shown in FIG. 2A, top reconstituted wafer 202 includes top dies 214, of which top dies 206, 208, 210, and 212 are individually labeled, and top molding compound 216 (or more generally "top passivation 216"). FIG. 2A shows top dies 214 being arranged in a grid-like pattern, with each being flanked by top molding compound 216. As shown in FIG. 2A, top molding compound 216 forms a border around and flanks each of top dies 214.

In one implementation, top dies 214 have been singulated from a same wafer, such as a silicon wafer. In other implementations, at least one of top dies 214 has been singulated from a different wafer than at least another of top dies 214. Furthermore, any or all of top dies 214 can be of substantially identical dimensions with respect to one another (e.g., width, length, thickness), or any dimension can be different. Any of top dies 214 can include an integrated circuit (IC) and/or other electrical components, such as, for example, passive components. In one implementation, each of top dies 214 includes an IC.

Top reconstituted wafer 202 can be fabricated utilizing various means. In one implementation, top reconstituted wafer 202 is fabricated utilizing embedded wafer level techniques, although in some implementations, other or additional techniques are utilized. In one specific implementation, top dies 214 are placed on an adhesive layer in a grid-like pattern. Top dies 214 are then covered with top molding compound 216 so as to be embedded within top molding compound 216. Subsequently, top molding compound 216 is thinned to form top reconstituted wafer 202. In the implementations shown, top molding compound 216 is thinned to reach top dies 214. However, in other implementations, a layer of top molding compound 216 can remain than covers each of top dies 214.

Bottom reconstituted wafer 204 can be fabricated by utilizing the same, similar, or different means as top reconstituted wafer 202. Similar to top dies 214 of top reconstituted wafer 202, bottom reconstituted wafer 204 includes a plurality of bottom dies, of which bottom die 224 is shown in FIG. 2B. Furthermore, similar to top dies 214, the plurality of bottom dies can be arranged in a grid-like pattern, which can be different than the grid-like pattern of top dies 214 (not shown). Also, similar to top dies 214, bottom molding compound 226 (or more generally "bottom passivation 226") forms a border around and flanks each of the plurality of bottom dies.

As shown in FIG. 2B, in some implementations, top reconstituted wafer 202 has top redistribution layer (top RDL) 228a. Additionally or instead, in some implementations, bottom reconstituted wafer 204 has bottom redistribution layer (bottom RDL) 228b. Top RDL 228a is electrically connected top die 206 and bottom RDL 228b is electrically connected to bottom die 224. Top RDL 228a and bottom RDL 228b include conductive material, such as copper and route respective top and bottom input and/or output (I/O) pads 230 and 232 of top die 206 and bottom die 224. Although only top RDL 228a, bottom RDL 228b, and top and bottom I/O pads 230 and 232 are shown, top reconstituted wafer 202 and bottom reconstituted wafer 204 each include a plurality of RDLs and I/O pads that are not visible in FIGS. 2A and 2B. Furthermore, any of the plurality of RDLs and I/O pads can be on either side of top reconstituted wafer 202 and bottom reconstituted wafer 204 and may include one or multiple levels or layers. As one example, top RDL 228a and top I/O pad 230 are on top side 222, but may be on bottom side 240 in some implementations (or may not be present at all).

As shown in FIG. 2B, top RDL 228a is on top die passivation 234 (which may also be referred to as "top die RDL passivation 234") and bottom RDL. 228b is on bottom die passivation 236 (which may also be referred to as "bottom die RDL passivation 236"). Also, bottom RDL passivation 238 is on bottom RDL 228b. Top die passivation 234, bottom die passivation 236, and bottom RDL passivation 238 each include dielectric material. For example, in the present implementation, top die passivation 234, bottom die passivation 236, and bottom RDL passivation 238 are dielectric polymers. In various implementations, top die passivation 234, bottom die passivation 236, and bottom RDL passivation 238 can be the same or different materials than one another.

As shown in FIGS. 2A and 2B, top reconstituted wafer 202 having top die 206 is stacked over bottom reconstituted wafer 204 having bottom die 224 to form reconstituted wafer stack 280. In one implementation, top reconstituted wafer 202 is fabricated separately from bottom reconstituted wafer 204 and top reconstituted wafer 202 is subsequently stacked over bottom reconstituted wafer 204. In other implementations, top reconstituted wafer 202 is formed over and/or on bottom reconstituted wafer 204, thereby stacking top reconstituted wafer 202 over bottom reconstituted wafer 204. While top reconstituted wafer 202 is stacked so that bottom side 240 faces downward, in other implementations, bottom side 240 can face upward. Also, in some implementations, bottom reconstituted wafer 204 is utilized as a carrier wafer.

In various implementations, any of top RDL 228a, bottom RDL 228b, top I/O pad 230, bottom I/O pad 232, top die passivation 234, bottom die passivation 236, and bottom RDL passivation 238 and/or other features can be formed prior to stacking top reconstituted wafer 202 over bottom reconstituted wafer 204. In some implementations, at least some of top RDL 228a, top I/O pad 230, top die passivation 234, and/or other features can be formed after stacking top reconstituted wafer 202 over bottom reconstituted wafer 204.

In various implementations, stacking includes adhering the top reconstituted wafer to the bottom reconstituted wafer using a passivation layer. For example, in the present implementation, stacking includes adhering top reconstituted wafer 202 to bottom reconstituted wafer 204 using bottom RDL passivation 238. Thus, reconstituted wafer stack 280 can be thin to provide high package density, as in the implementation shown.

Figure 2C:
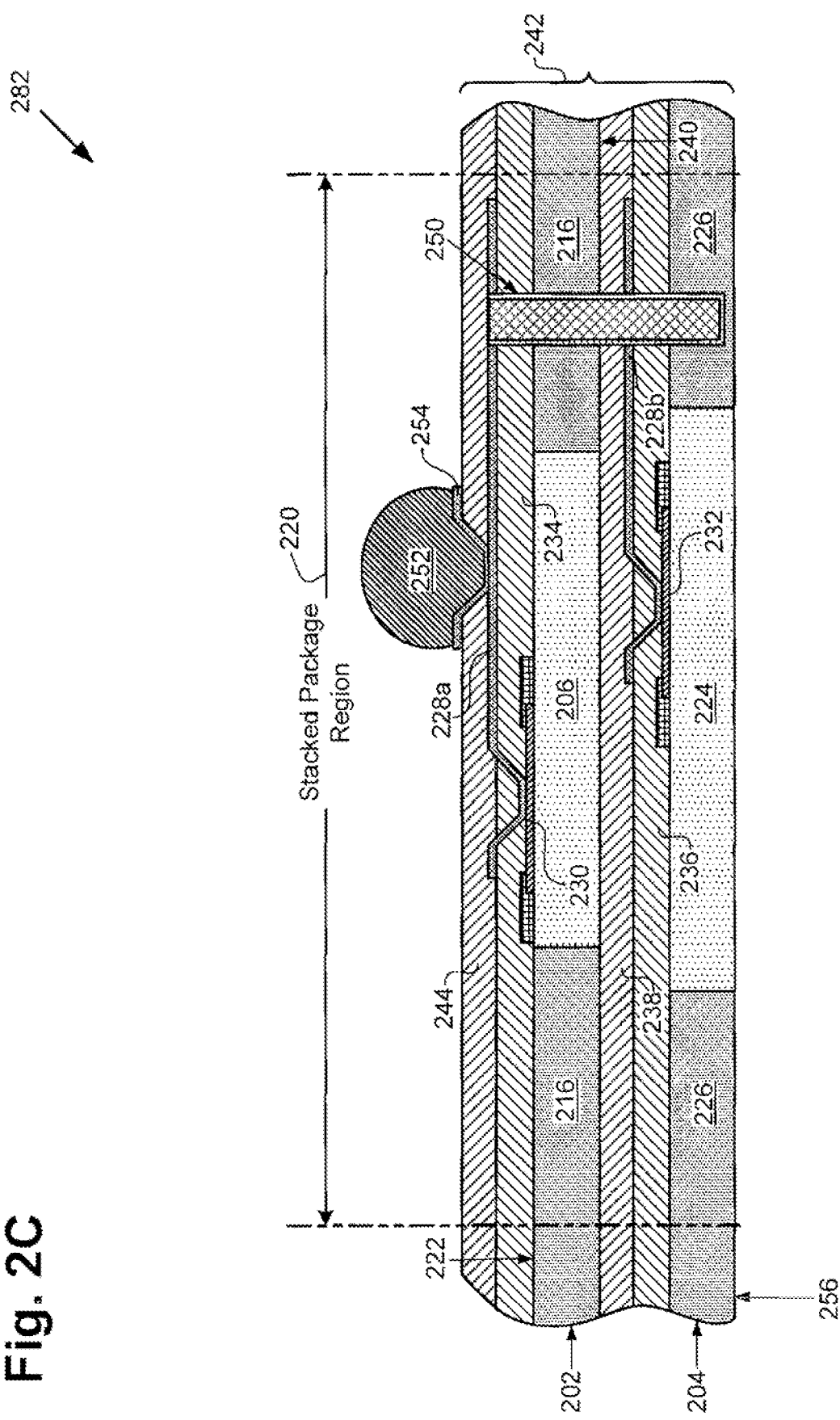
FIG. 2C presents an exemplary cross-sectional view of a portion of a reconstituted wafer stack, according to an implementation of the present disclosure.

Referring now to flowchart 100 of FIG. 1 and FIG. 2C, flowchart 100 includes interconnecting the top die of the top reconstituted wafer and the bottom die of the bottom reconstituted wafer through an insulation arrangement (action 172 in flowchart 100). FIG. 2C shows a portion of reconstituted wafer stack 282, which results from action 172 being performed on reconstituted wafer stack 280, in accordance with implementations of the present disclosure. In the present implementation, top die 206 of top reconstituted wafer 202 and bottom die 224 of bottom reconstituted wafer 224 are interconnected through insulation arrangement 242.

In the present implementation, insulation arrangement 242 includes top molding compound 216, bottom molding compound 226, top die passivation 234, bottom die passivation 236, bottom RDL passivation 238, and top RDL passivation 244. However, in other implementations, insulation arrangement 242 can have different constituents and/or additional constituents.

In some implementations, interconnecting comprises forming a conductive via through the insulation arrangement. However, interconnecting can be accomplished in various manners. FIG. 2C shows conductive via 250 formed through insulation arrangement 242. Forming conductive via 250 through insulation arrangement 242 can include drilling a hole through at least one of top molding compound 216, bottom molding compound 226, top die passivation 234, bottom die passivation 236, bottom RDL passivation 238, and top RDL passivation 244 (although a hole is not drilled through top RDL passivation 244 in the implementation shown). The hole can be drilled, for example, utilizing a mechanical drill, a laser, or other means.

In the present implementation, a hole is drilled through bottom molding compound 226, top die passivation 234, bottom die passivation 236, and bottom RDL passivation 238, as well as top RDL 228a and bottom RDL 228b of reconstituted wafer stack 280 in FIG. 2B. The hole can subsequently be filled with conductive material to form conductive via 250, thereby shorting top RDL 228a and bottom RDL 228b. Top RDL passivation 244 can later be formed on top RDL 228a. Top RDL passivation 244 includes dielectric material, such as a dielectric polymer, as one example. It is noted that in various implementations, top RDL passivation 244 and/or other constituents can be formed prior to drilling the hole and the present disclosure is not limited by the specific implementation shown.

Thus, as described above, in the present implementation, top die 206 of top reconstituted wafer 202 and bottom die 224 of bottom reconstituted wafer 204 are interconnected by connecting top RDL 228a to bottom RDL 228b. More particularly, top die 206 and bottom die 224 are interconnected by forming conductive via 250 through top RDL 228a and optionally through bottom RDL 228b.

Referring now to flowchart 100 of FIG. 1 and FIG. 2C, flowchart 100 includes forming package terminals for connection to the top die of the top reconstituted wafer and the bottom die of the bottom reconstituted wafer (action 174 in flowchart 100). For example, FIG. 2C shows reconstituted wafer stack 282, which results from action 174 being performed on reconstituted wafer stack 280, in accordance with implementations of the present disclosure. In the present implementation, package terminal 252 is formed for connection to both top die 206 of top reconstituted wafer 202 and bottom die 224 of bottom reconstituted wafer 204. Package terminal 252 is also formed for connection to both top RDL 228a and bottom RDL 228b.

In the present implementation, package terminal 252 is formed in top RDL passivation 244 on under bump metallization (UBM) 254 and top RDL 228a. It is noted that UBM 254 is optional. For example, in some implementations, package terminal 252 is formed in top RDL passivation 224 and on top RDL 228a. Also, in the present implementation, package terminal 252 is a solder ball that is part of a ball grid array (BGA). While package terminal 252 is shown as a solder ball, package terminal 252 is exemplary and other types of package terminals can be employed in addition to or instead of a solder ball. In one implementation, for example, a conductive pad is utilized as a package terminal. Also, while only one package terminal is shown, a plurality of package terminals can be formed. For example, reconstituted wafer stack 282 can include, additional package terminals for connection to only one of top die 206 or bottom die 224 or other constituents (not shown). The additional package terminals can be formed concurrently or non-concurrently with package terminal 252, in accordance with various implementations.

It is noted that while flowchart 100 shows action 174 as being after action 172, in accordance with various implementations, action 174 can occur before, during, and/or after action 172.

Figure 2D:
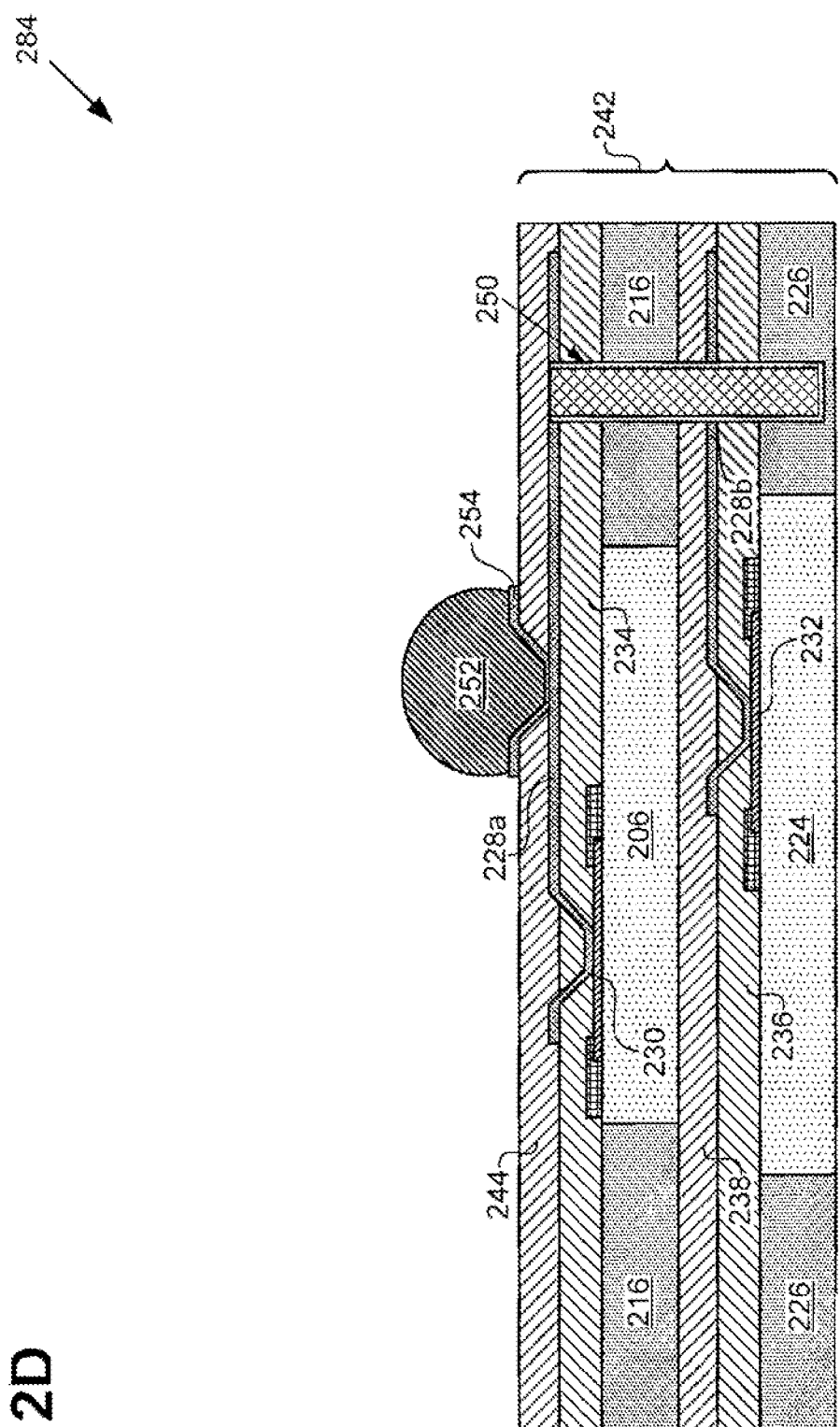
FIG. 2D presents an exemplary cross-sectional view of a stacked package, according to an implementation of the present disclosure.

Referring now to flowchart 100 of FIG. 1 and FIGS. 2C and 2D, flowchart 100 includes singulating the reconstituted wafer stack to form individual stacked packages (action 176 in flowchart 100). For example, in the present implementation, reconstituted wafer stack 282 of FIG. 2C is singulated to form stacked package 284. More particularly, reconstituted wafer stack 282 is singulated along stacked package region 218 shown in FIG. 2A. Other individual stacked packages are formed while singulating reconstituted wafer stack 282, which may be substantially similar to or different than stacked package 284.

While stacked package 284 includes only top die 206 and bottom die 224, in other implementations, stacked package 284 includes more than two dies. For example, stacked package region 218 can include additional dies within top reconstituted wafer 202 and/or bottom reconstituted wafer 204. As one example, top die 208 in FIG. 2A can be within stacked package region 218. Furthermore, the additional dies can be interconnected with each other, top die 206 and/or bottom die 224 through insulation arrangement 242 utilizing any of RDLs, conductive vias (e.g. conductive via 250), and or other means. For example, top RDL 228a can interconnect top die 206 and top die 208. Also, while only top reconstituted wafer 202 and bottom reconstituted wafer 204 are shown, stacked package 284 can include dies from other reconstituted wafers. For example, one or more additional reconstituted wafers can be in any of reconstituted wafer stacks 280 and 282. Also, additional RDLs, passivation, and other constituents can be included with the one or more additional reconstituted wafers.

Furthermore, while only conductive via 250 is shown, more than one conductive via can be utilized to connect dies from different reconstituted wafers. In one implementation, the conductive vias extend through at least top molding compound 216 of insulation arrangement 242. Furthermore, where stacked package 284 includes a die from an additional reconstituted wafer (not shown), a conductive via (or other interconnect) may interconnect the die to only one of or to both of top die 206 and bottom die 224.

In the present implementation, package terminal 252 and/or other package terminals are formed prior to singulating reconstituted wafer stack 282 to form stacked package 284. However, in other implementations, package terminal 252 and/or other package terminals can be formed after reconstituted wafer stack 282 is singulated. Furthermore, in some implementations, top die 206 and bottom die 224 and/or other dies can be interconnected after singulating reconstituted wafer stack 282.

However, by forming package terminal 252 and/or other package terminals and interconnecting top die 206 and bottom die 224 and/or other dies prior to singulating reconstituted wafer stack 282, stacked package 284 can be simply and efficiently formed utilizing wafer level and/or panel (e.g. substrate) level processes. For example, in accordance with some implementations, the method illustrated by flowchart 100 is performed utilizing only wafer level and/or panel level processes on top reconstituted wafer 202 and bottom reconstituted wafer 204. Thus, among other advantages, stacked package 284 can be much thinner than packages that could be formed utilizing package level processes.

As shown in FIG. 2D, stacked package 284 includes top die 206 from top reconstituted wafer 202 situated over bottom die 224 from bottom reconstituted wafer 204. Top die 206 and bottom die 224 are insulated from one another by insulation arrangement 242. Insulation arrangement 242 includes top molding compound 216 that flanks top die 206 and bottom molding compound 226 that flanks bottom die 224, where top molding compound 216 is situated over bottom molding compound 226.

Top die 206 and bottom die 224 are interconnected through insulation arrangement 242. More particularly, top die 206 and bottom die 224 are interconnected through top molding compound 216. In the present implementation, top die 206 and bottom die 224 are interconnected through conductive via 250, which extends within insulation arrangement 242. Top die 206 has top RDL 228a, and bottom die 224 has bottom RDL 228a that is connected to top RDL 228a through conductive via 250.

Thus, as described above, top die 206 and bottom die 224 can be interconnected through insulation arrangement 242, effectively and efficiently. For example, insulation arrangement 242 can facilitate interconnection between top die 206 and bottom die 224 while providing sufficient mechanical support for stacked package 284. Furthermore, top RDL 228a and bottom RDL 228b can be easily interconnected by connecting top RDL 228a to bottom RDL 228b using, for example, conductive via 250 formed through insulation arrangement 242.

By utilizing RDLs, such as top RDL 228a and bottom RDL 228b, and wafer and/or panel level processes, stacked package 284 can advantageously support higher levels of functionality while accommodating additional circuitry and/or dies without complicating packaging and reducing package density. For example, additional RDLs, I/O pads, and/or dies can easily be incorporated into stacked package 284 as desired without substantially complicating packaging and increasing package density.

Also, in various implementations, a carrier wafer is utilized to fabricate bottom reconstituted wafer 204 and is utilized as part of stacked package 284. For example, the carrier wafer can be a silicon wafer or a substrate panel that is integrated into stacked package 284. For example, the carrier wafer could be integrated into stacked package 284 as a heat sink. In one implementation, the carrier wafer is a copper leadframe panel.

Figure 3:
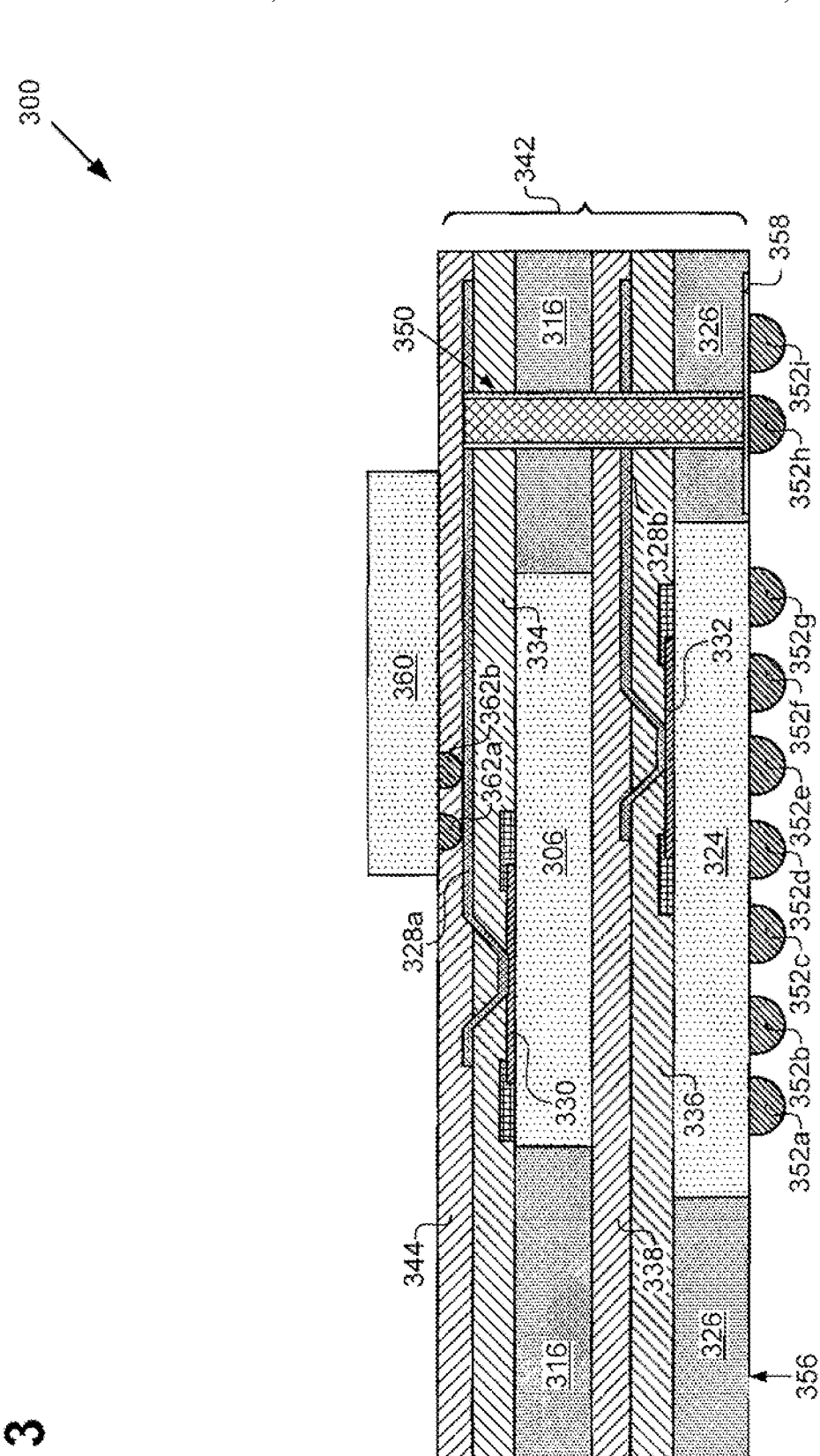
FIG. 3 presents an exemplary cross-sectional view of a stacked package, according to an implementation of the present disclosure.

Referring now to FIG. 3, FIG. 3 presents a cross-sectional view of stacked package 300, according to an implementation of the present disclosure. Stacked package 300 can be fabricated utilizing the method for manufacturing a stacked package illustrated by flowchart 100. Stacked package 300 includes top die 306, top molding compound 316, bottom die 324, bottom molding compound 326, top RDL 328a, bottom RDL 328b, top I/O pad 330, bottom I/O pad 332, top die passivation 334, bottom die passivation 336, bottom RDL passivation 338, top RDL passivation 344, insulation arrangement 342, and conductive via 350, corresponding respectively to top die 206, top molding compound 216, bottom die 224, bottom molding compound 226, top RDL 228a, bottom RDL 228b, top I/O pad 230, bottom I/O pad 232, top die passivation 234, bottom die passivation 236, bottom RDL passivation 238, top RDL passivation 244, insulation arrangement 242, and conductive via 250 in stacked package 284 of FIG. 2I).

While stacked package 284 has package terminal 252 on top side 222 of top reconstituted wafer 202, at least one package terminal can be formed on bottom side 256 of bottom reconstituted wafer 204 in addition to or instead of on top side 222. For example, stacked package 300 includes package terminals 352a, 352b, 352c, 352d, 352e, 352f, and 352g on bottom die 324 and bottom side 356. Package terminals 352a, 352b, 352c, 352d, 352e, 352f, and 352g may be only for connection to bottom die 324 or may also or instead be for connection to top die 306 and/or other dies. Stacked package 300 also includes package terminals 352h and 352i on conductive interface 358 and bottom side 356. Like package terminal 252 in FIG. 2C, package terminals 352a, 352b, 352c, 352d, 352e, 352f, 352g, 352h and 352i can be solder balls that are part of a BGA or can be other types of package terminals. While not shown, in some implementations, stacked package 300 has additional solder balls on molding compound 326 for mechanical stability.

Stacked package 300 also has electrical component 360 connected to top die 306 through top RDL 328a. Electrical component 360 is an individual die in the present implementation, is on top RDL passivation 344, and is connected to top die 306 through top RDL passivation 344 by interconnects 362a and 362b. Electrical component 360 can also be connected to top die 306 through other RDLs and/or other interconnects not shown in FIG. 3. Furthermore, at least one additional individual die can be connected to top die 306 in a same or different manner than individual die 306. In one implementation, electrical component 360 is connected to top die 306 prior to singulating a reconstituted wafer stack to form stacked package 300. In another implementation, electrical component 360 is connected to top die 306 after singulating a reconstituted wafer stack to form stacked package 300 (e.g., after action 176). Furthermore, in some implementations, electrical component 360 is on bottom side 356 of stacked package 300.

Thus, as described above, implementations of the present disclosure result in a stacked package having a top die from a top reconstituted wafer and a bottom die from a bottom reconstituted wafer. In various implementations, complications in packaging and reduced package density can advantageously be avoided or minimized while still providing for a stacked package that has a high level of functionality. Furthermore, it will be appreciated that implementations of the present disclosure offer significant flexibility in coping with limited component space and layout options.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A wafer stack, comprising:
a bottom die;
a top die situated over the bottom die;
a bottom molding compound that flanks the bottom die;
a top molding compound that flanks the top die;
a first passivation structure in contact with the bottom die, bottom molding compound, top die, and top molding compound, wherein the first passivation structure comprises:
a first passivation layer in contact with the bottom die and the bottom molding compound, and
a second passivation layer in contact with the top die, top molding compound, and first passivation layer, and
a conductive via extending through at least a portion of the bottom molding compound, top molding compound, and the first passivation structure,
wherein the top die and the bottom die are concurrently singulatable from the wafer stack.

2. The wafer stack of claim 1, wherein:
the bottom die is in a portion of a bottom wafer,
the top die is in a portion of a top wafer, and
the top wafer is situated over the bottom wafer.

3. The wafer stack of claim 1, wherein the first passivation layer is in contact with a top surface of the bottom die and the second passivation layer is in contact with a bottom surface of the top die.

4. The wafer stack of claim 1, further comprising a redistribution layer extending through at least a portion of the first passivation layer and the second passivation layer.

5. The wafer stack of claim 1, wherein a width of the bottom die is different from a width of the top die.

6. The wafer stack of claim 1, further comprising a conductive interface on a bottom surface of the bottom molding compound, wherein the conductive via is in contact with the conductive interface.

7. The wafer stack of claim 1, further comprising a second passivation structure in contact with the top die and the top molding compound.

8. A stacked package, comprising:
a first die in a singulatable portion of a first reconstituted wafer;
a first molding compound that flanks the first die;
a second die in a singulatable portion of a second reconstituted wafer, the second die being situated over the first die;
a second molding compound that flanks the second die;
a first insulation structure in contact with the first die, first molding compound, second die, and second molding compound;
a second insulation structure in contact with the second die and the second molding compound, wherein the second insulation structure comprises:
a third layer in contact with the second die and the second molding compound; and
a fourth layer in contact with the third layer;
a redistribution layer extending through at least a portion of the third layer and the fourth layer; and
a conductive via extending through at least a portion of the first molding compound, second molding compound, and first insulation structure.

9. The stacked package of claim 8, wherein the first insulation structure comprises:
a first layer in contact with the first die and the first molding compound; and
a second layer in contact with the second die, second molding compound, and first layer.

10. The stacked package of claim 8, wherein:
the first reconstituted wafer and the second reconstituted wafer form a wafer stack, and
the first die and the second die are concurrently singulatable from the wafer stack.

11. A reconstituted wafer stack, comprising:
a first wafer comprising:
a first plurality of dies, and
a first molding compound that flanks the first plurality of dies;
a second wafer situated over the first wafer, the second wafer comprising:
a second plurality of dies, and
a second molding compound that flanks the second plurality of dies;
a first passivation structure in contact with the first plurality of dies, first molding compound, second plurality of dies, and second molding compound, wherein the first passivation structure comprises:
a first passivation layer in contact with the first plurality of dies and first molding compound; and
a second passivation layer in contact with the second plurality of dies, the second molding compound, and first passivation layer, and
a plurality of conductive vias, each conductive via extending through at least a portion of the first wafer and second wafer, wherein a first die of the first plurality of dies and a second die of the second plurality of dies are concurrently singulatable from the reconstituted stack.

12. The reconstituted wafer stack of claim 11, wherein each conductive via extends through at least a portion of the first molding compound, second molding compound, and first passivation structure.

13. The reconstituted wafer stack of claim 11, wherein at least one die of the first plurality of dies is different in dimension from at least one die of the second plurality of dies.

14. The reconstituted wafer stack of claim 11, wherein at least one die of the first plurality of dies is different in dimension from at least one other die of the first plurality of dies.

15. The reconstituted wafer stack of claim 11, wherein each of the second plurality of dies is situated over at least one of the first plurality of dies, and is concurrently separable from the reconstituted wafer stack with the at least one of the first plurality of dies.

16. The reconstituted wafer stack of claim 11, wherein:
the reconstituted wafer stack comprises a plurality of stacked packages,
each stacked package comprises one or more dies of the first plurality of dies and one or more dies of the second plurality of dies, and
each stacked package is separable from the reconstituted wafer stack.

17. The reconstituted wafer stack of claim 16, wherein the plurality of stacked packages are concurrently separable from the reconstituted wafer stack.

18. The reconstituted wafer stack of claim 16, wherein each stacked package further comprises a portion of the first molding compound, a portion of the second molding compound, a portion of the first passivation structure, and at least one of the plurality of conductive vias.

19. The reconstituted wafer stack of claim 11, further comprising a second passivation structure in contact with the second plurality of dies and the second molding compound.

20. The reconstituted wafer stack of claim 19, wherein the second passivation layer comprises:
a third passivation layer in contact with the second plurality of dies and the second molding compound; and
a fourth passivation layer in contact with the third passivation layer.

* * * * *